US012684892B2

(12) United States Patent
Sakurai et al.

(10) Patent No.: US 12,684,892 B2
(45) Date of Patent: Jul. 14, 2026

(54) COMPOUND SEMICONDUCTOR DEVICE

(71) Applicant: Asahi Kasei Microdevices Corporation, Tokyo (JP)

(72) Inventors: Yoshiki Sakurai, Tokyo (JP); Daiki Yasuda, Tokyo (JP)

(73) Assignee: Asahi Kasei Microdevices Corpoation, Tokyo (JP)

( * ) Notice: Subject to any disclaimer, the term of this patent is extended or adjusted under 35 U.S.C. 154(b) by 504 days.

(21) Appl. No.: 18/330,545

(22) Filed: Jun. 7, 2023

(65) Prior Publication Data

US 2023/0395733 A1 Dec. 7, 2023

(30) Foreign Application Priority Data

Jun. 7, 2022 (JP) ................................. 2022-092524
Jun. 1, 2023 (JP) ................................. 2023-091205

(51) Int. Cl.
H10F 77/30 (2025.01)
H10F 77/124 (2025.01)
(Continued)

(52) U.S. Cl.
CPC ....... H10F 77/306 (2025.01); H10F 77/1248 (2025.01); H10H 20/84 (2025.01); *H10F 77/147* (2025.01); *H10H 20/821* (2025.01)

(58) Field of Classification Search
CPC .. H10F 77/306; H10F 77/1248; H10F 77/147; H10F 77/124; H10F 77/334;
(Continued)

(56) References Cited

U.S. PATENT DOCUMENTS 10,297,708 B1 5/2019 Ariyawansa et al.
2007/0090337 A1 4/2007 Koichiro et al.
(Continued)

FOREIGN PATENT DOCUMENTS

CN 103996764 A * 5/2014
CN 10399674 A * 8/2014
(Continued)

OTHER PUBLICATIONS

Droop improvement in high current range on PSS-LEDs S. Tanaka, Y. Zhao, I. Koslow, C.-C. Pan, H.-T. Chen, J. Sonoda, S.P. DenBaars, and S. Nakamura, Electronics Letters Mar. 3, 2011 vol. 47 No. 5 https://digital-library.theiet.org/doi/abs/10.1049/el.2010.3306 (Year: 2011).*

*Primary Examiner* — Matthew L Reames
(74) *Attorney, Agent, or Firm* — KENJA IP LAW PC

(57) ABSTRACT
A compound semiconductor device having a high SNR is provided. A compound semiconductor device (1) includes an insulating substrate (10); a plurality of mesa-type compound semiconductor laminate portions (20) including a first compound semiconductor layer (21) having a first conductivity type, an active layer (23) made of a compound semiconductor material, and a second compound semiconductor layer (25) having a second conductivity type laminated in this order; a first protective film (31); a second protective film (32) made of a material having a film density greater than that of the first protective film (31); and a recess (40) including recess side surfaces (40a) and a recess bottom surface (40b) for separating the plurality of mesa-type compound semiconductor laminate portion. The recess side surface and the recess bottom surface are covered with the first protective film and the second protective film.

20 Claims, 9 Drawing Sheets

(51) Int. Cl.
    *H10F 77/14*         (2025.01)
    *H10H 20/821*      (2025.01)
    *H10H 20/84*       (2025.01)

(58) Field of Classification Search
    CPC ...... H10H 20/84; H10H 20/819; H10H 29/14;
                             H10H 29/142
    See application file for complete search history.

(56)              References Cited

U.S. PATENT DOCUMENTS

| | | | | |
|---|---|---|---|---|
| 2009/0134425 A1* | 5/2009 | Nagai | ................... | H10H 29/142 |
| | | | | 257/E33.058 |
| 2014/0131657 A1* | 5/2014 | Kim | .................... | H10H 29/142 |
| | | | | 257/13 |
| 2018/0287005 A1 | 10/2018 | Camargo et al. | | |
| 2020/0052175 A1* | 2/2020 | Oh | ........................ | H10H 29/142 |

FOREIGN PATENT DOCUMENTS

| | | |
|---|---|---|
| JP | 2009206357 A | 9/2009 |
| JP | 2014157928 A | 8/2014 |
| JP | 2017015507 A | 1/2017 |
| JP | 2018174297 A | 11/2018 |
| WO | 2005027228 A1 | 3/2005 |

* cited by examiner

FIG. 9

COMPOUND SEMICONDUCTOR DEVICE

This application claims priority of Japanese Patent Application No. 2022-092524 (filed Jun. 7, 2022) and Japanese Patent Application No. 2023-091205 (filed Jun. 1, 2023), the entire contents of which are incorporated herein by reference.

TECHNICAL FIELD

The present disclosure relates to a compound semiconductor device.

BACKGROUND

Compound semiconductor devices are a wide variety of devices in which compound semiconductors are employed. An example of compound semiconductor devices is the quantum-type infrared detector disclosed in WO 2005/027228 A1 (PTL 1), for example. The compound semiconductor device disclosed in PTL 1 suppresses diffusion current due to the laminate structure and the device structure of a compound semiconductor in the sensor portion. Furthermore, because the integrated circuit (IC) for signal amplification and the package of the sensor are improved, an infrared detector that can operate at room temperature and is smaller in size is provided.

CITATION LIST

Patent Literature

PTL 1: WO 2005/027228 A1

SUMMARY

Although research and development have been made to improve the characteristics of compound semiconductor devices as described above, further improvement in the signal-to-noise ratio (SNR) characteristic is desired.

In light of the situation set forth above, an object of the present disclosure is to provide a compound semiconductor device having a high SNR.

(1) A compound semiconductor device in accordance with one embodiment of the present disclosure comprises:

an insulating substrate;

a plurality of mesa-type compound semiconductor laminate portions formed on one primary surface of the insulating substrate, the plurality of mesa-type compound semiconductor laminate portions each having a first compound semiconductor layer having a first conductivity type, an active layer made of a compound semiconductor material, and a second compound semiconductor layer having a second conductivity type, which are laminated in this order;

a first protective film formed so as to be in direct contact with side surfaces of the mesa-type compound semiconductor laminate portions;

a second protective film formed on the first protective film and made of a material having a film density greater than that of the first protective film; and a recess comprising recess side surfaces at least partially facing parts of side surfaces of the first compound semiconductor layer and a recess bottom surface at least partially facing a part of a surface of the insulating substrate on a side of the first compound semiconductor layer, the recess separating the plurality of mesa-type compound semiconductor laminate portions from each other, the recess side surfaces and the recess bottom surface being covered with the first protective film and the second protective film.

(2) As one embodiment of the present disclosure, in (1), the active layer comprises at least a group III element.

(3) As one embodiment of the present disclosure, in (1) or (2), the active layer has a carrier concentration of $4.1 \times 10^{16}$ $cm^{-3}$ or less at 300 K.

(4) As one embodiment of the present disclosure, in any of (1) to (3), the active layer comprises at least In, and Sb or As.

(5) As one embodiment of the present disclosure, in any of (1) to (4), wherein a ratio n (%) of an Al composition to all group III elements in a layer of the active layer satisfies $0 \leq n \leq 18$.

(6) As one embodiment of the present disclosure, in any of (1) to (5), wherein the ratio n (%) of the Al composition to the all group III elements in the layer of the active layer satisfies $0 \leq n \leq 9.8$.

(7) As one embodiment of the present disclosure, in any of (1) to (6), the first protective film is made of a material having a film density of less than 2.25 $g/cm^3$.

(8) As one embodiment of the present disclosure, in any of (1) to (7), the first protective film is made of silicon oxide.

(9) As one embodiment of the present disclosure, in any of (1) to (8), the second protective film is made of silicon nitride.

(10) As one embodiment of the present disclosure, in any of (1) to (9), a thickness of the second protective film is greater than a thickness of the first protective film.

(11) As one embodiment of the present disclosure, in (10), the thickness of the second protective film is twice or more the thickness of the first protective film.

(12) As one embodiment of the present disclosure, in any of (1) to (11), the thickness of the first protective film is smaller than a depth of the recess.

(13) As one embodiment of the present disclosure, in any of (1) to (12), a total thickness of the first protective film and the second protective film is smaller than the depth of the recess.

(14) As one embodiment of the present disclosure, in any of (1) to (13), the part of a surface of the insulating substrate facing the bottom portion of the recess is formed by removing a part of the insulating substrate.

(15) As one embodiment of the present disclosure, in (14), the total thickness of the first protective film and the second protective film is smaller than a maximum depth of a removed portion relative to an unremoved portion of the insulating substrate.

(16) As one embodiment of the present disclosure, in any of (1) to (15), another major surface of the insulating substrate is a light-receiving surface or a light-emitting surface.

Advantageous Effect

According to the present disclosure, a compound semiconductor device having a high SNR can be provided.

BRIEF DESCRIPTION OF THE DRAWINGS

In the accompanying drawings:

FIG. 9 is a cross-sectional view illustrating another example of the configuration of a compound semiconductor device.

DETAILED DESCRIPTION

[Compound Semiconductor Device]

Figure 1:
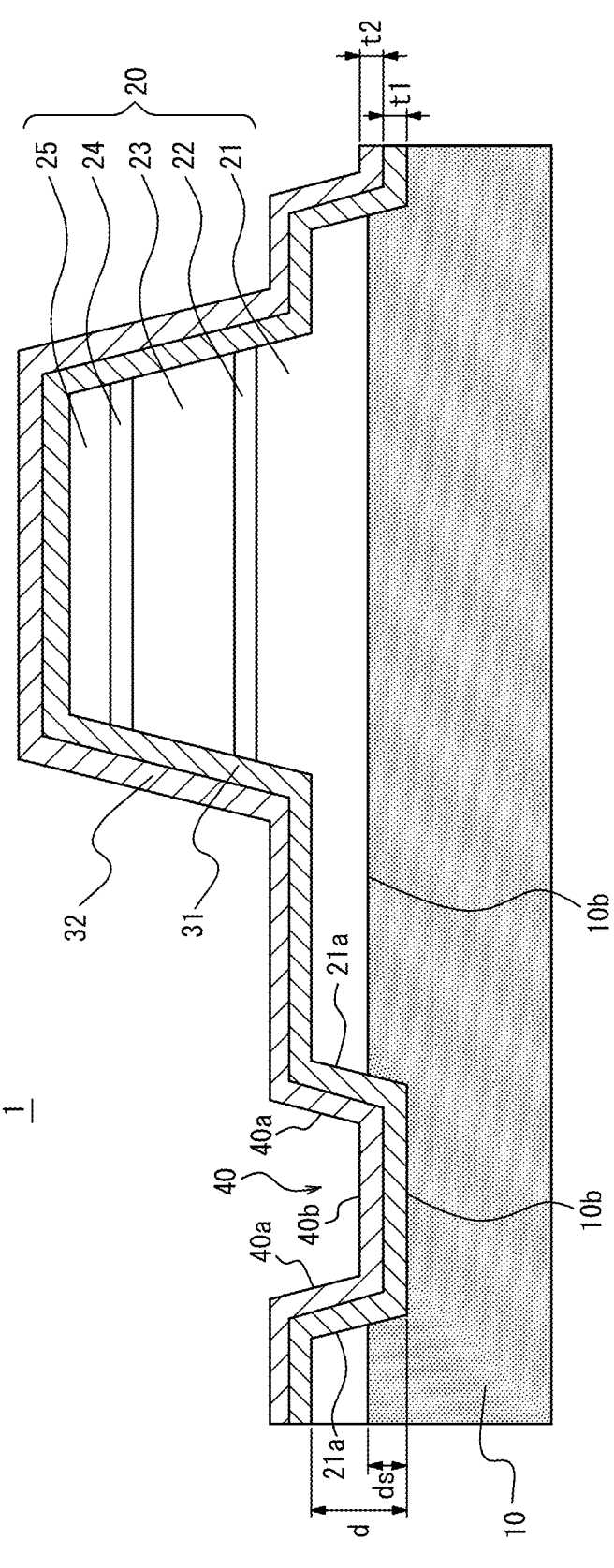
FIG. 1 is a cross-sectional view related to compound semiconductor devices of Example 1 and Example 2.

A compound semiconductor device according to one embodiment of the present disclosure includes an insulating substrate, mesa-type compound semiconductor laminate portions, a first protective film, and a second protective film. The mesa-type compound semiconductor laminate portions each include a first compound semiconductor layer formed on the insulating substrate and having a first conductivity type, an active layer formed on the first compound semiconductor layer and made of a compound semiconductor material, and a second compound semiconductor layer formed on the active layer and having a second conductivity type. In the mesa-type compound semiconductor laminate portions, the first compound semiconductor layer, the active layer, and the second compound semiconductor layer are laminated in this order. Here, the expression "the first compound semiconductor layer, the active layer, and the second compound semiconductor layer are laminated in this order" refers to any structure as long as the first compound semiconductor layer, the active layer, and the second compound semiconductor layer are laminated in this order with regard to the relationship among these layers. A mode of the configuration of "the first compound semiconductor layer, the active layer, and the second compound semiconductor layer are laminated in this order" may include cases where another layer is disposed between the first compound semiconductor layer and the active layer, for example. A mode of the configuration of "the first compound semiconductor layer, the active layer, and the second compound semiconductor layer are laminated in this order" may also include cases where another layer is disposed between the active layer and the second compound semiconductor layer. Furthermore, the mesa-type compound semiconductor laminate portions are disposed on one primary surface of the insulating substrate. As used herein, the primary surfaces are the surfaces perpendicular to the thickness direction of the insulating substrate and are the surfaces having the largest area among the six surfaces of the insulating substrate. In the present embodiment, the first protective film is formed so as to be in direct contact with the side surfaces of the mesa-type compound semiconductor laminate portions. The second protective film is made of a material having a greater (higher) film density than the film density of the first protective film and is formed on the first protective film. The compound semiconductor device according to the present embodiment includes a recess of which bottom is defined by at least a part of the insulating substrate. In other words, the compound semiconductor device includes the recess, and at least part of the bottom surface of the recess is in contact with the insulating substrate. The side surfaces and the bottom surface of the recess are covered with the first protective film and the second protective film.

[Mesa-Type Compound Semiconductor Laminate Portion]

The mesa-type compound semiconductor laminate portions each have a mesa structure. The configuration of the mesa-type compound semiconductor laminate portions is not limited as long as the mesa-type compound semiconductor laminate portions have a PN junction type or a PIN junction type diode structure. The first conductive semiconductor layer and the second conductive semiconductor layer have opposite conductivity types. For example, when the first conductive semiconductor layer is p-type, the second conductive semiconductor layer is n-type. For example, when the first conductive semiconductor layer is n-type, the second conductive semiconductor layer is p-type. Examples of the materials of the first conductive semiconductor layer and the second conductive semiconductor layer include, but are not limited to, InSb, InAsSb, and AlInSb. In addition, the first conductive semiconductor layer and the second conductive semiconductor layer may have a lamination structure where multiple materials are laminated.

Here, the SNR of a compound semiconductor device is proportional to the product of the photocurrent Ip generated when infrared light enters the mesa-type compound semiconductor laminate portion and the square root of the device resistance R0 of the compound semiconductor device. Specifically, the SNR is expressed by following expression.

$$\text{SNR} \propto Ip\sqrt{R0}$$

Accordingly, the SNR characteristic of the compound semiconductor device can be improved when the device resistance R0 is increased while the photocurrent Ip is maintained.

Figure 7:
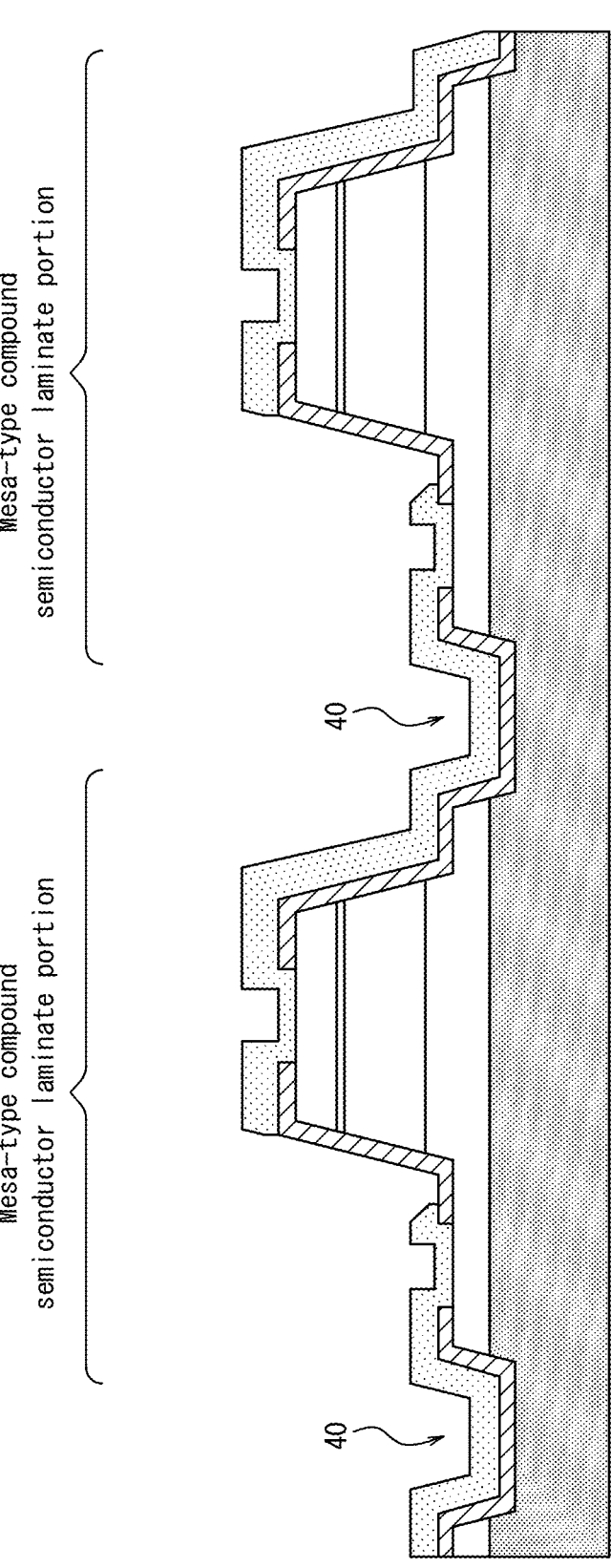
FIG. 7 is a diagram illustrating an exemplary arrangement of a plurality of mesa-type compound semiconductor laminate portions.

The device resistance R0 of a compound semiconductor device is known to be negatively affected by leakage current between mesa-type compound semiconductor laminate portions that have been electrically separated by an etching step. FIG. 7 is a diagram illustrating an exemplary arrangement of a plurality of mesa-type compound semiconductor laminate portions. In general, a compound semiconductor device is formed to have a plurality of mesa-type compound semiconductor laminate portions. The device resistance R0 can be increased when the leakage current between the plurality of mesa-type compound semiconductor laminate portions in the compound semiconductor device is suppressed. The structure of the compound semiconductor device according to the present embodiment to be described below suppresses leakage current.

The active layer is a light-receiving layer or a light-emitting layer. The material of the active layer is not limited as long as the material is a compound semiconductor material and generates a photocurrent upon receiving or emitting light. In particular, a material that generates a photocurrent upon receiving or emitting infrared light having a wavelength of 2.5 to 6.0 μm is preferred. In addition, the active layer may have a structure where multiple materials are laminated. The active layer preferably contains at least group III elements, and $Al_xIn_{1-x}Sb$ $(0 \leq x \leq 18)$ is preferably used from the viewpoint of characteristics and mass production. In other words, the ratio of the Al composition to the all group III elements in the layer of the active layer is preferably from 0 to 18%. $Al_xIn_{1-x}Sb$ $(0 \leq x \leq 9.8)$ is more preferably used. In other words, the ratio of the Al composition to the all group III elements in the layer of the active layer is more preferably from 0 to 9.8%. Alternatively, As may be used in stead of Sb. In other words, the active layer may contain at least In, and Sb or As. In addition, from the viewpoint of preventing the device resistance R0 from decreasing, the active layer is doped with Zn, Sn, or the like, and the carrier concentration in the active layer is preferably adjusted to be sufficiently small. Specifically, the carrier concentration is preferably $4.1 \times 10^{16}$ $cm^{-3}$ or less at 300 K.

The mesa-type compound semiconductor laminate portions may further include a first wide band gap layer having a band gap greater than that of the first conductive semiconductor layer, between the first conductive semiconductor layer and the active layer. In addition, the mesa-type compound semiconductor laminate portions may further include a second wide band gap layer having a band gap greater than that of the second conductive semiconductor layer, between the second conductive semiconductor layer and the active layer. The wide band gap layers serve as layers for preventing diffusion current from the active layer. It is suffice that the wide band gap layers have a sufficient band offset to the active layer, and a material having a wide band gap is preferably selected for wide the band gap layers. Examples of the material of the wide band gap layers include, but are not limited to, AlInAsSb and AlInSb.

(Measurement Method of Al Composition)

The Al composition of each layer of the mesa-type compound semiconductor laminate portions is determined by the secondary ion mass spectrometry (SIMS) method. A magnetic field type SIMS apparatus IMS 7f manufactured by CAMECA may be used for measurements. In this method, compositional analysis is performed by irradiating a solid surface with a beam of primary ion species, digging in the depth direction by means of sputtering phenomenon, and simultaneously detecting the generated secondary ions. As used herein, the Al composition of each layer refers to the ratio of Al element to all Group III elements (Group 13 elements) contained in the each layer.

Specifically, cesium ion ($Cs^+$) can be used as the primary ion species, the primary ion energy is set to 2.5 keV, and the beam incident angle is set to 67.2°. Under these conditions, $MCs^+$ (where M is Al, Ga, In, As, Sb, or the like) with a small matrix effect can be detected as the secondary ion species to be detected.

Here, a compositional analysis of the target layer is carried out by sputtering to the depth of the target layer. The depth of the target layer can be determined based on the thickness of each layer determined by a cross sectional TEM measurement to be described later. The sputtering time in an SIMS analysis is determined based on the depth to the target layer and the sputtering rate. The sputtering rate can be determined from the sputtering time upon a measurement of a sample (such as a standard sample described below) and the depth of the sample measured with a stylus profilometer, for example.

The Al composition in each layer is determined from the signal intensities of $MCs^+$ described above. For example, in the case of an AlInSb layer, the Al composition can be obtained by: (signal intensity of $AlCs^+$)/((signal intensity of $AlCs^+$)+(signal intensity of $InCs^+$)). Even if each layer has a uniform composition in the depth direction, the signal intensity may have a profile in the depth direction due to the influence of sputtering. When the signal intensity has a profile in the depth direction, the maximum signal intensity may be used as the representing signal intensity of each layer.

Here, the quantitative value of the Al composition obtained by the analysis can be accompanied by an error from the true value. For error correction from the true value, a separate sample is prepared and the value of the lattice constant thereof is determined with the X-ray diffraction (XRD) method, so that the sample is used as a standard sample having a known Al composition value. A SIMS analysis is then performed under the conditions for measurements of the Al composition of each layer in the first compound semiconductor layer. In this way, the sensitivity coefficient of the Al composition to the signal intensity was determined. The SIMS signal intensity at each layer in the first compound semiconductor layer is multiplied by the sensitivity coefficient to thereby more accurately determine the Al composition of the each layer.

$Al_xIn_{1-x}Sb$ laminated on a GaAs substrate to a thickness of 800 nm can be used as another standard sample. The lattice constant of this sample may be determined, and the Al composition x of the standard sample may be determined. The lattice constant can be determined by the X-ray diffraction (XRD) method using an X-ray diffractometer X'Pert MPD manufactured by Spectris Co., Ltd.

A 2θ-ω scan by means of X-ray diffraction is carried out, and the lattice constant in the direction normal to the substrate surface of each layer in the mesa-type compound semiconductor laminate portions is determined from the peak position of the plane index of the plane corresponding to the plane orientation of the substrate surface in the 2θ-ω scan. Thereafter, the Al composition x can be determined from the lattice constant in the normal direction using Vegard's rule on the assumption that the $Al_xIn_{1-x}Sb$ layer has no anisotropic distortion. The Vegard's rule is specifically represented by the following expression.

$$a_{AlInSb} = xa_{AlSb} + (1-x)a_{InSb}$$

where $a_{AlSb}$ is the lattice constant of AlSb, $a_{InSb}$ is the lattice constant of InSb, and $a_{AlInSb}$ is the lattice constant of the $Al_xIn_{1-x}Sb$ layer determined by the above X-ray diffraction. $a_{AlSb}$ may be 6.1355 Å, and, $a_{InSb}$ may be 6.4794.

A sample having an Al composition x of $0.10 < x < 0.15$ may be used as a standard sample used for SIMS measurements.

[First Protective Film]

The first protective film is a protective film made of an insulating material formed so as to be in direct contact with the side surfaces of the mesa-type compound semiconductor laminate portions and covers the side surfaces of the mesa-type compound semiconductor laminate portions. The first protective film in the compound semiconductor device of the present embodiment covers not only the side surfaces but also recesses provided between adjacent mesa-type compound semiconductor laminate portions. The material of the first protective film needs to be a material having a film density smaller than the film density of the second protective film from the viewpoint of minimizing stress on the mesa-type compound semiconductor laminate portions and suppressing degradation of the characteristics. The first protective film is preferably made of a material having a film density smaller than 2.25 g/cm³. Specifically, the first protective film is preferably silicon oxide. In a case where a material having a small (low) film density, i.e., a material having a high water absorbability, is used as the first protective film, cracks may be induced in the second protective film formed on the first protective film due to swelling caused by water absorption. Therefore, from the viewpoint of suppressing water absorption of the first protective film, the first protective film is preferably structured to be embedded in the recesses, in other words, the thickness of the first protective film is preferably smaller than the depth of the recess.

[Second Protective Film]

The second protective film is a protective film made of an insulating material formed on the first protective film, and has a water absorbability lower than the water absorbability of the material of the first protective film. Specifically, the second protective film is characterized to be made of a material having a film density greater than that of the first protective film. Specifically, the film density is preferably greater than 2.35 g/cm³. For example, silicon nitride or silicon oxynitride can be selected for the second protective film. From the viewpoint of controllability of the material properties and mass production, in cases where the first protective film is made of silicon oxide, the second protective film is preferably made of silicon nitride which can be easily formed in a plasma CVD apparatus in a manner similar to silicon oxide. From the viewpoint of providing a high-quality compound semiconductor device that is less likely to experience cracks even if the first protective film swells due to water absorption, the thickness of the second protective film is preferably twice or more the thickness of the first protective film.

(Measurement Method of Thicknesses of Protective Films)

The thicknesses of the protective films can be measured by the cross-sectional transmission electron spectroscopy (TEM) method. Specifically, the FIB apparatus FB-2100 manufactured by Hitachi High-Technologies Corporation can be used. A sample having a thickness of 500 nm or less was prepared while carrying out measurement by the FIB method. The cross-section of the sample was observed as the transmission image under STEM apparatus HD-2300A manufactured by Hitachi at an acceleration voltage of 200 kV, and the thickness of the protective film was measured.

[Insulating Substrate]

In the compound semiconductor device of the present embodiment, it is preferable that the mesa-type compound semiconductor laminate portions are disposed on one primary surface of the insulating substrate, and that the other primary surface of the insulating substrate is the light-receiving surface or the light-emitting surface. One example of the insulating substrate is a semiconductor substrate, and examples thereof specifically include, but are not limited to, a GaAs substrate, a Si substrate, an InP substrate, an InSb substrate, and an InAs substrate. One example is a ceramic substrate, etc.

An electrode to extract current to the outside is provided on the upper surface of a mesa-type compound semiconductor laminate portion. By using the other primary surface having no electrode provided thereon as the light-receiving surface or the light-emitting surface, efficient entry of infrared light into the mesa-type compound semiconductor laminate portions or efficient emission of infrared light from the mesa-type compound semiconductor laminate portion can be achieved. In this case, because the light is made to be received on the insulating substrate side or emitted from the insulating substrate side, an insulating substrate made of a material having a larger band gap than the material of the active layer is preferably used. In this case, a GaAs substrate is preferred because it has a band gap greater than that of the active layer, and a compound semiconductor crystal is easily grown.

There is no limitation on doping of the insulating substrate with donor impurities or acceptor impurities.

To connect the plurality of mesa-type compound semiconductor laminate portions formed on the insulating substrate in series or parallel, the mesa-type compound semiconductor laminate portions need to be electrically separated from each other. The electrical separation can be achieved by removing conductive materials between the mesa-type compound semiconductor laminate portions by etching or the like, so that each mesa-type compound semiconductor laminate portion is not electrically and physically connected to the other mesa-type compound semiconductor laminate portions. In addition, to prevent conduction due to insufficient etching, recesses are preferably formed between the mesa-type compound semiconductor laminate portions, wherein the bottoms of the recesses are defined by at least the bottom of the insulating substrate. For example, a dry etching method can be used to remove the conductive material and form the recesses. Thereafter, a protective film made of a uniform insulating material is formed as the first protective film on the entire surface by PCVD or the like. Furthermore, a second protective film is formed to prevent the degradation and destruction of the first protective film caused by water absorption. Thus, the compound semiconductor device of the present embodiment has recesses, and the side surfaces (recess side surfaces) and bottom surfaces (recess bottom surfaces) of the recesses are covered with the first protective film and the second protective film. Here, in the present embodiment, the thickness of the first protective film is smaller than the depth of the recess, and the first protective film is embedded in the recess.

[Band Pass Filter]

The compound semiconductor device of the present embodiment may further include a band pass filter that permits transmission of 50% or more of light in a certain wavelength band in the wavelength range of at least 2.5 to 6.0 μm. The band pass filter limits the sensitivity wavelength range of the compound semiconductor device, so that the compound semiconductor device is made to be less affected by interfering gases having absorption bands in other wavelength ranges when the compound semiconductor device is used as a gas sensor.

[Electrode Portion]

The compound semiconductor device of the present embodiment further includes a first electrode electrically connected to the first conductive semiconductor layer in a mesa-type compound semiconductor laminate portion, and a second electrode electrically connected to the second conductive semiconductor layer in the mesa-type compound semiconductor laminate portion. The material of the electrodes preferably is a material of which contact resistance with the compound semiconductor laminate portion is a low and of which electrical resistance is low. Specifically, Ti, Ni, Pt, Cr, Al, and Cu are exemplified. In addition, the electrode may also be made of a laminate of multiple electrode materials.

Hereinafter, an example of the configuration of a compound semiconductor device of the present embodiment will be described with reference to the drawings. Examples 1, 2, and 3 will be described below as specific examples of the configuration of the semiconductor device of the present embodiment. In addition, for indicating the effects of the compound semiconductor device of the present embodiment, Comparative Examples 1 and 2 will also be described below as examples of comparative configurations which are partially different.

Figure 2:
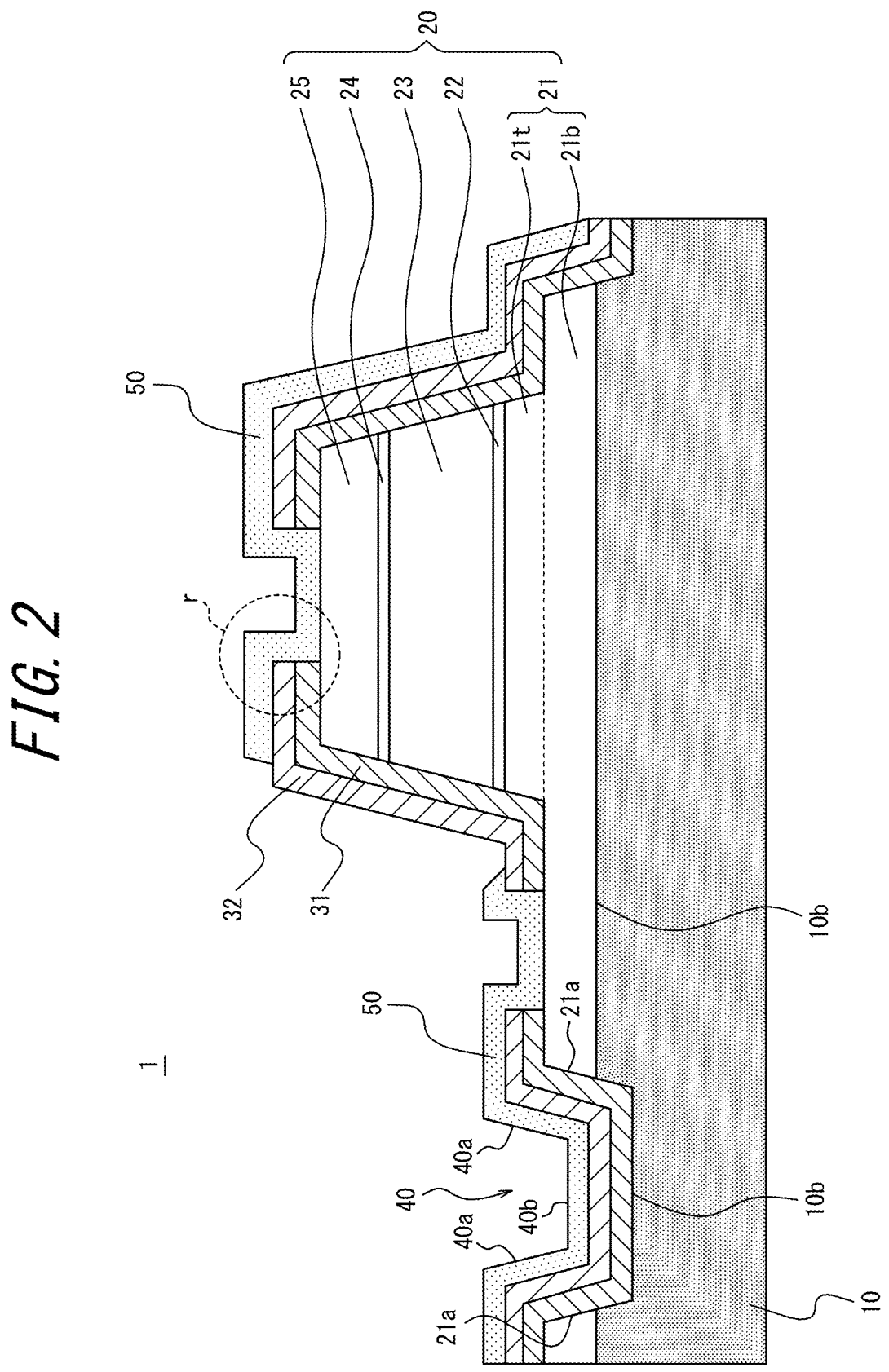
FIG. 2 is a cross-sectional view illustrating compound semiconductor devices of Example 1 and Example 2.

FIGS. 1 and 2 are schematic cross-sectional views of compound semiconductor devices 1 of Example 1 and Example 2. FIG. 1 illustrates the state before parts of the first protective film 31 and the second protective film 32 are removed and electrode portions 50 are disposed. Specifically, after the state illustrated in FIG. 1, contact holes are formed in a part of the upper surface of a mesa-type compound semiconductor laminate portion 20 and a part of the upper surface of the lower portion 21b of a first conductive semiconductor layer 21. Electrode portions 50 are then disposed to provide the cross section of the compound semiconductor devices 1 of Example 1 and Example 2 (FIG. 2). Here, as illustrated in FIG. 2, the first conductive semiconductor layer 21 may be referred to by two portions bordered by the step: the upper portion 21T and the lower portion 21B.

The compound semiconductor device 1 includes an insulating substrate 10, a first conductive semiconductor layer 21, a first wide band gap layer 22, an active layer 23, a second wide band gap layer 24, and a second conductive semiconductor layer 25. The first conducting semiconductor layer 21, the first wide band gap layer 22, the active layer 23, the second wide band gap layer 24, and the second conducting semiconductor layer 25 configure a mesa-type compound semiconductor laminate portion 20. The compound semiconductor devices 1 of Examples 1 and 2 also include a first protective film 31 so as to be in direct contact with the side surfaces of the mesa-type compound semiconductor laminate portion 20. The first protective film 31 is also in direct contact with the top surface of the mesa-type compound semiconductor laminate portion 20 and the upper surface of the lower portion 21b of the first conductive semiconductor layer 21. The compound semiconductor devices 1 of Example 1 and Example 2 have recesses 40. The recesses 40 each have recess side surfaces 40a and a recess bottom surface 40b. The recess side surfaces 40a partially face parts of the side surfaces 21a of the first conductive semiconductor layer 21 (first compound semiconductor layer). The bottom surface of the recess 40b partially faces a part of the surface 10b of the insulating substrate 10 on the first conductive semiconductor layer 21 side. In addition, the recess bottom surface 40b is the bottom surface connecting the two recess side surfaces 40a of the recess 40. The recesses 40 separate the plurality of mesa-type compound semiconductor laminate portions from each other (see FIG. 7). The compound semiconductor devices 1 of Example 1 and Example 2 further include a second protective film 32 on the upper surface of the first protective film 31. As another example, the compound semiconductor device 1 may have a configuration in which the second protective film 32 is omitted and the first protective film 31 is in direct contact with the recess bottom surface 40b. Because the recess side surfaces 40a and the recess bottom surface 40b of the recess 40 are covered with the first protective film 31 made of silicon oxide, leakage current between the adjacent mesa-type compound semiconductor laminate portions 20 through the recesses 40 can be suppressed. Furthermore, because the first protective film 31 is covered with the second protective film 32 made of silicon nitride having a large film density and having a low water absorbability, swelling of the first protective film 31 caused by water absorption can be suppressed. In other words, the recess side surfaces 40a and the recess bottom surface 40b are even more preferably covered with the first protective film 31 and the second protective film 32.

Figure 8A:
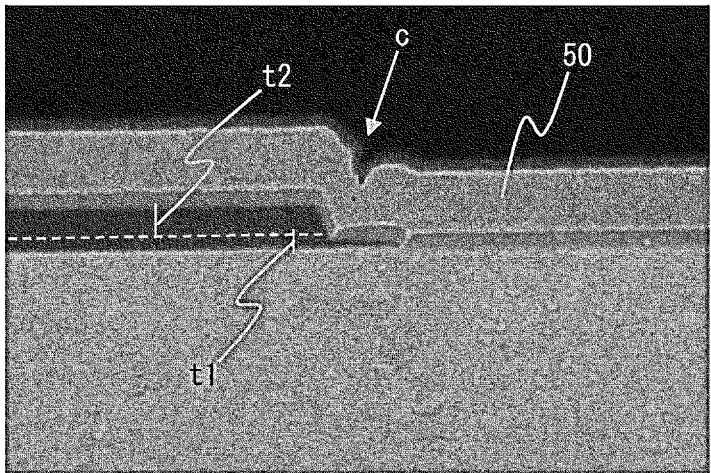
FIG. 8A is a diagram illustrating an example of the configuration of the thicknesses of the first protective film and the second protective film.
Figure 8B:
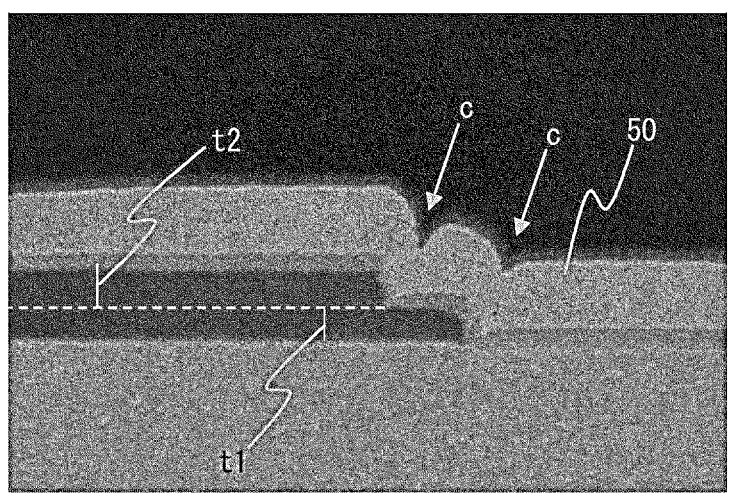
FIG. 8B is a diagram illustrating another example of the configuration of the thicknesses of the first protective film and the second protective film.
Figure 8C:
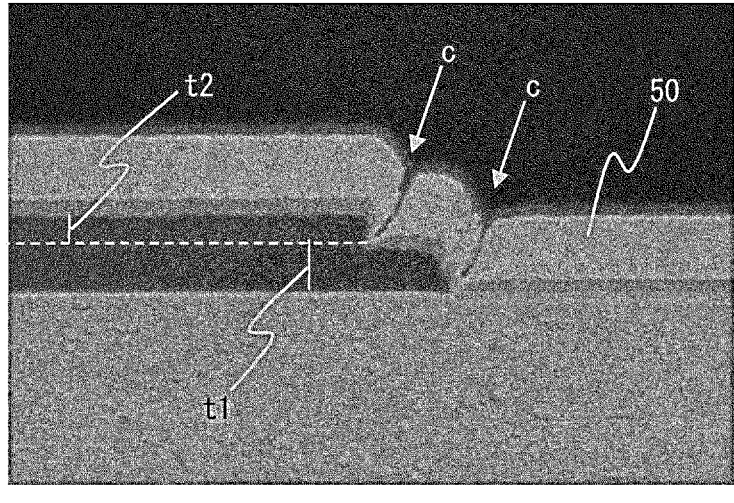
FIG. 8C a diagram illustrating another example of the configuration of the thicknesses of the first protective film and the second protective film.

In addition, the thickness of the first protective film 31 (t1 in FIG. 1) is smaller than the depth of the recess 40 (d in FIG. 1), the first protective film 31 is embedded in the recess 40, and the upper surface of the first protective film 31 is positioned to be lower than the upper surface (upper end) of the recess 40. In other words, the part of the surface of the insulating substrate 10 facing the recess bottom surface 40b is formed by removing a part of the insulating substrate 10. The ds in FIG. 1 indicates the maximum depth of the removed portion relative to the unremoved portion of the insulating substrate 10. ds is 0 or greater, and ds is greater than 0 in configurations where the first protective film 31 is embedded in the recess 40. Such a configuration suppresses swelling of the first protective film 31 caused by water absorption. Furthermore, even if the first protective film 31 has absorbed moisture due to exposure to a humid environment for a long time, the space inside the recess 40 without the first protective film 31 functions as a buffer region, so that peeling of the first protective film 31 is prevented and good insulation properties are maintained. Here, the thickness of the second protective film (t2 in FIG. 1) may be greater than the thickness of the first protective film. For example, as depicted in FIG. 8A, in the case where the thickness of the second protective film (t2) was twice or more the thickness of the first protective film 31 (t1), the number of cracks (c) in the electrode portion 50 was 1 and the crack depth was as small as 113 nm. As depicted in FIG. 8B, for example, in the case where the thickness of the second protective film (t2) was less than twice the thickness of the first protective film 31 (t1), the number of cracks (c) in the electrode portion 50 increased to 2 but the crack depth was as low as 121 nm. In contrast, as depicted in FIG. 8C, for example, in the case where the thickness of the second protective film (t2) was smaller than the thickness of the first protective film 31 (t1), the number of cracks (c) in the electrode 50 was 2 and the crack depth was 316 nm. As evident from the comparisons of the Experimental Examples in FIGS. 8A to 8C, the results indicated that the film coverage of the electrodes was improved and compound semiconductor devices 1 having higher qualities were obtained as the thickness of the first protective film 31 (t1) was reduced with respect to the thickness of the second protective film (t2). Here, FIGS. 8A to 8C correspond to the region indicated by r in FIG. 2.

Figure 9:
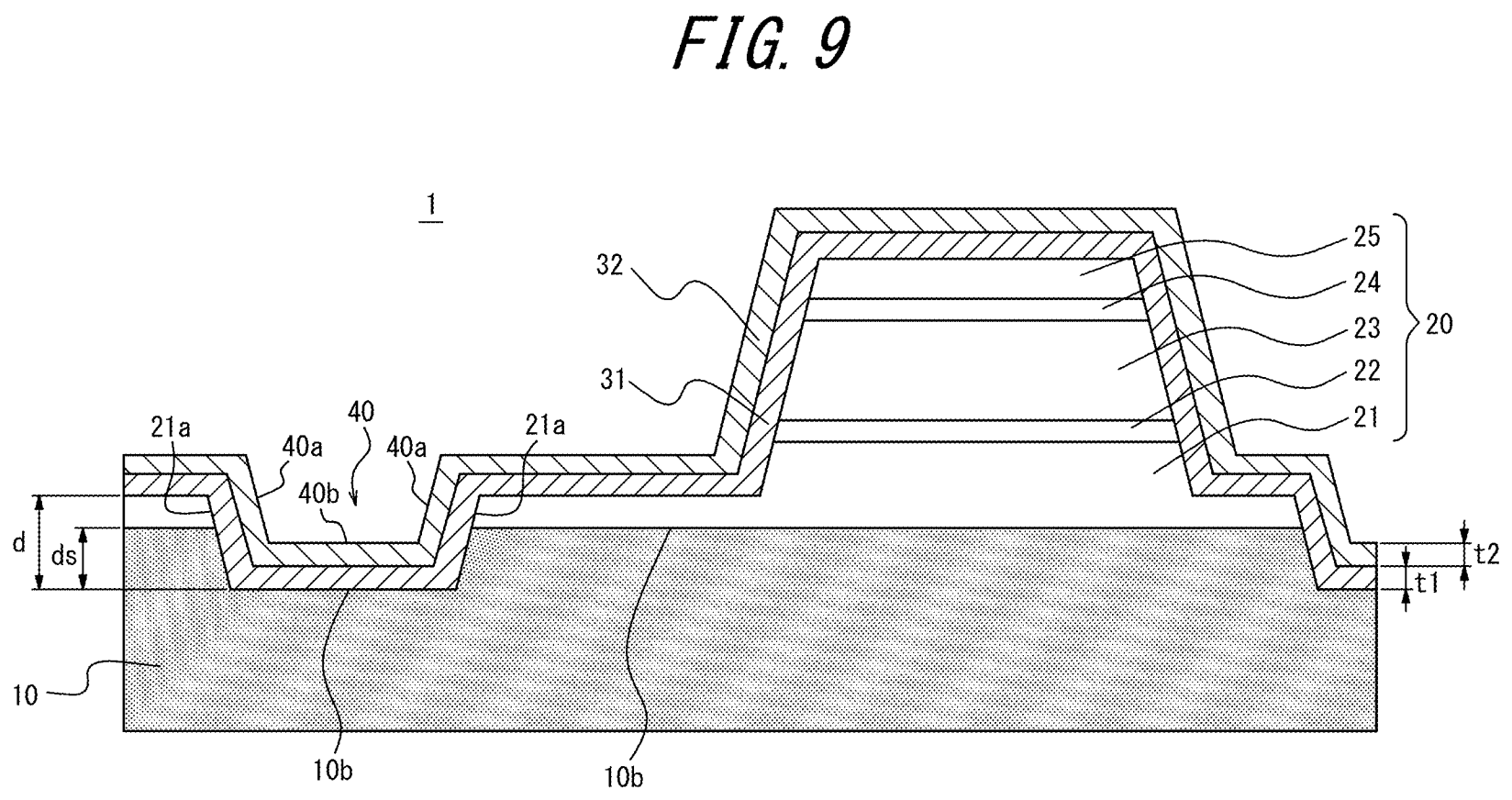

Furthermore, a configuration where the thickness (t1+t2) which is the sum of the thickness of the first protective film 31 and the thickness of the second protective film 32 is smaller than the depth of the recess 40 may also be possible. Specifically, in the recess 40, the second protective film 32 may also be embedded in the recess 40, and the upper surface of the second protective film 32 is positioned to be lower than the upper surface of the recess 40. Alternatively, as illustrated in FIG. 9, the total thickness of the first protective film and the second protective film (t1+t2) may be smaller than the maximum depth (ds) of the removed portion relative to the unremoved portion of the insulating substrate 10. Specifically, a configuration in which the upper surface of the second protective film 32 is positioned to be lower than the boundary between the insulating substrate 10 and the first conductive semiconductor layer 21 is also possible.

Figure 3:
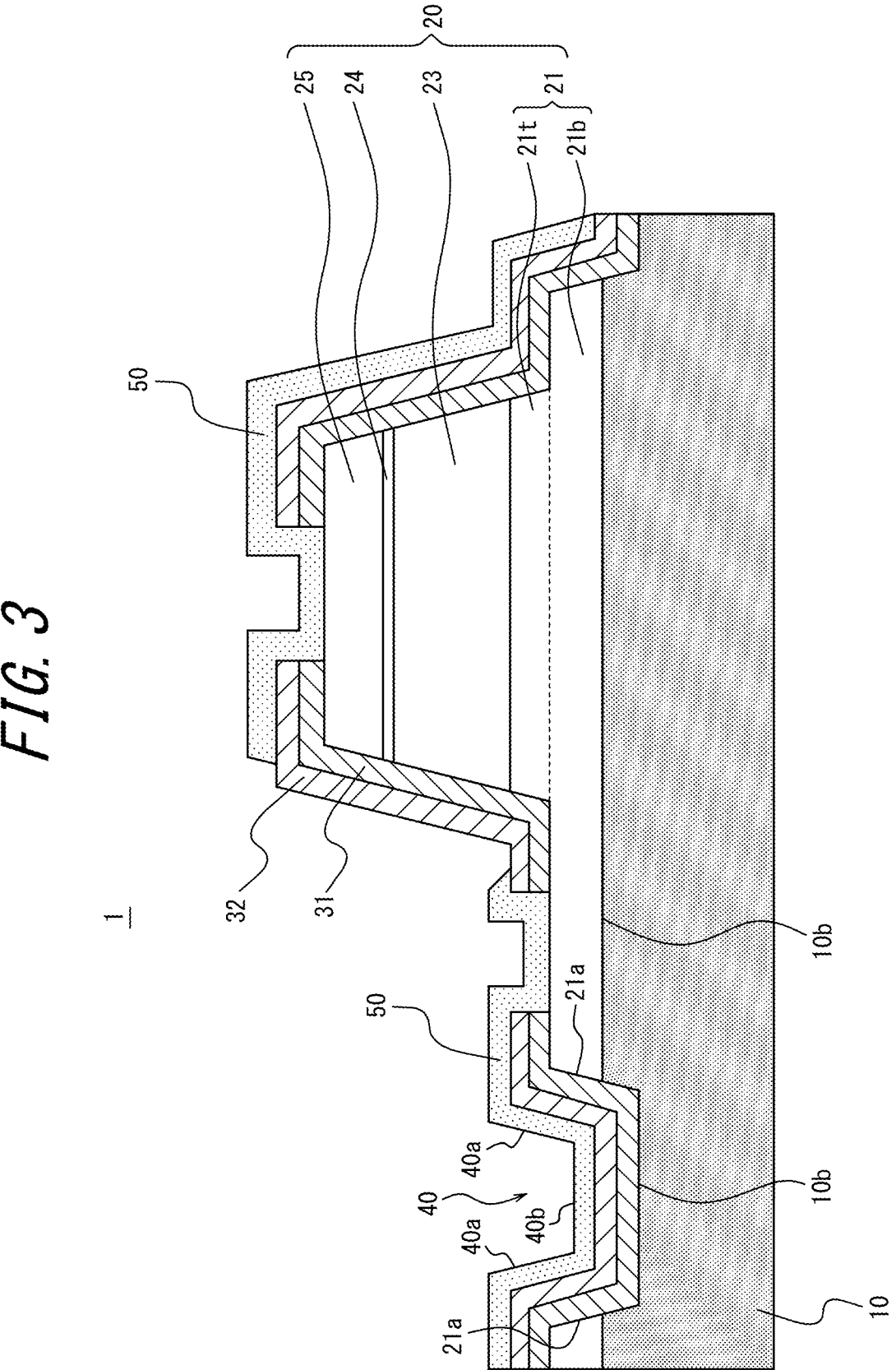
FIG. 3 is a cross-sectional view illustrating a compound semiconductor device of Example 3.

FIG. 3 is a schematic cross-sectional view of a compound semiconductor device 1 of Example 3. Unlike the compound semiconductor devices 1 of Example 1 and Example 2, the compound semiconductor device 1 of Example 3 does not include the first wide band gap layer 22.

Figure 4:
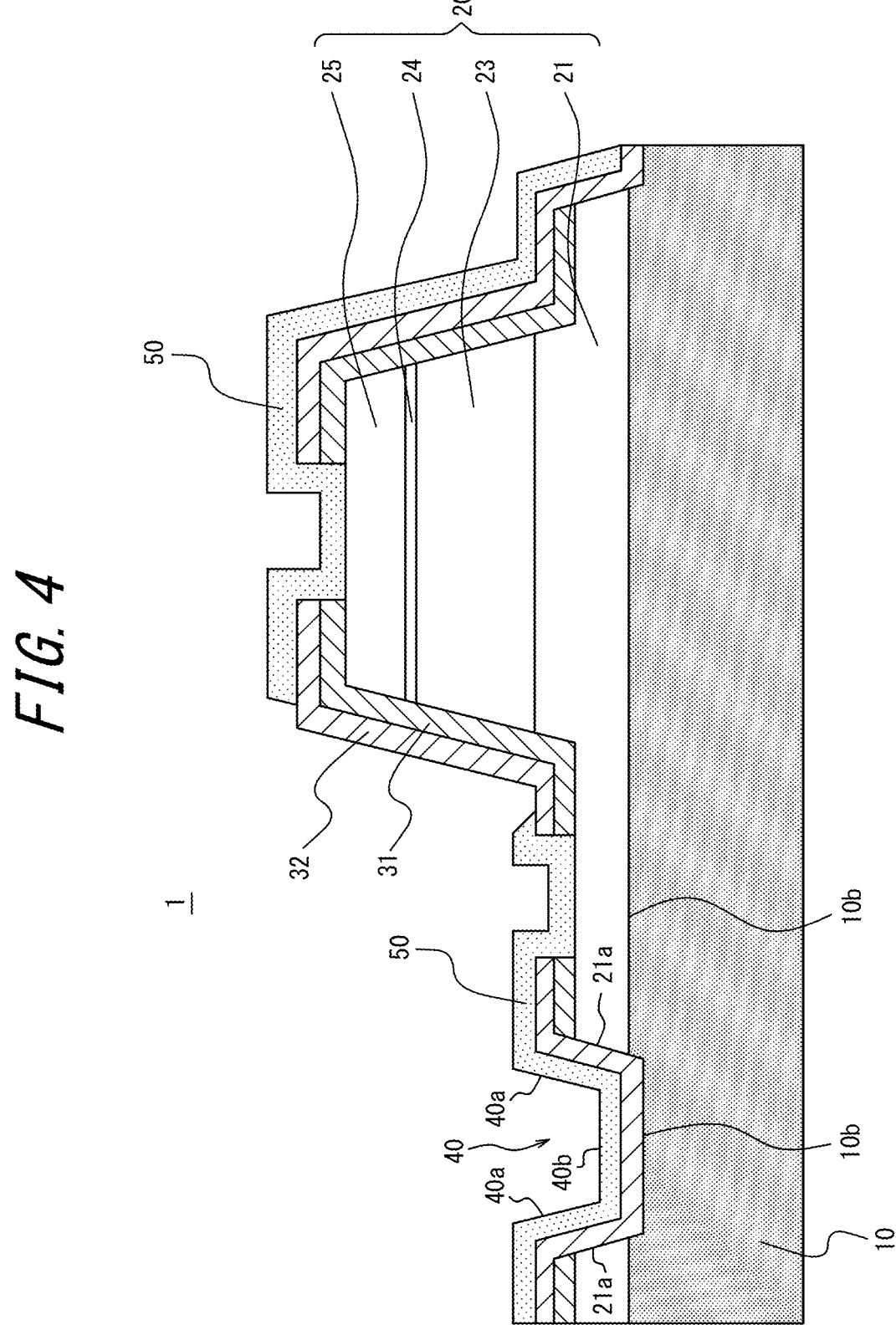
FIG. 4 is a cross-sectional view illustrating a compound semiconductor device of Comparative Example 1.

FIG. 4 is a schematic cross-sectional view of a compound semiconductor device 1 of Comparative Example 2. Unlike the compound semiconductor device 1 of Example 3, the compound semiconductor device 1 of Comparative Example 1 does not have the first protective film 31 in the recess 40.

Figure 5:
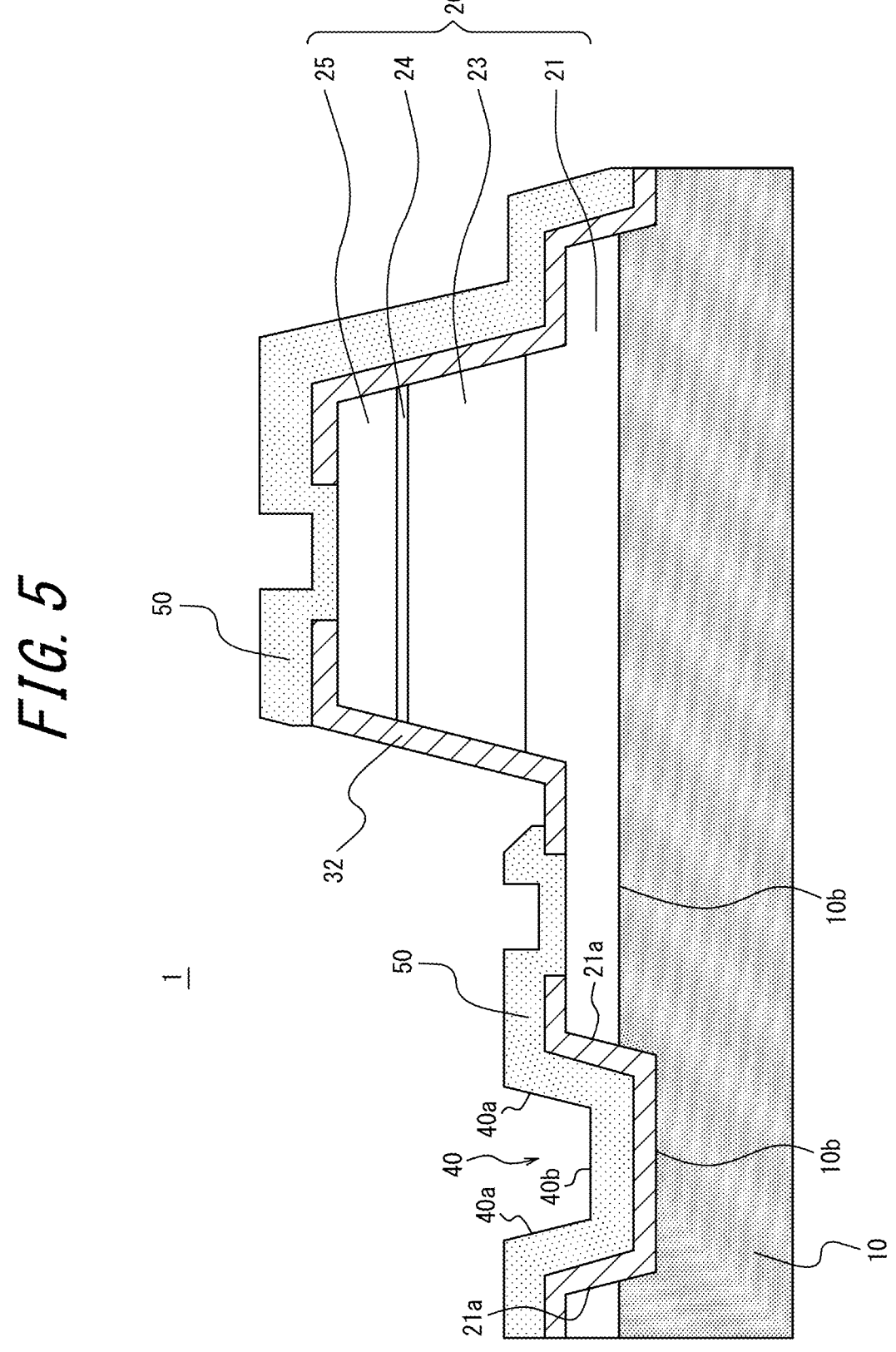
FIG. 5 is a cross-sectional view illustrating a compound semiconductor device of Comparative Example 2.

FIG. 5 is a schematic cross-sectional view of a compound semiconductor device 1 of Comparative Example 2. Unlike the compound semiconductor device 1 of Example 3, the compound semiconductor device 1 of Comparative Example 2 includes neither the recess 40a nor the first protective film 31 as a whole.

Hereinafter, details of each of Examples 1 to 3 and Comparative Examples 1 to 2 will be described below.

Example 1

On a GaAs substrate as the insulating substrate 10, the first conductive semiconductor layer 21, the first wide band gap layer 22, the active layer 23, the second wide band gap layer 24, and the second conductive semiconductor layer 25 were sequentially laminated in an MBE apparatus. In this lamination step, an n-type InSb layer having a thickness of 0.5 $\mu$m and doped with $7 \times 10^{18}$ ($cm^{-3}$) of Sn and an n-type $Al_{0.098}In_{0.902}Sb$ layer having a thickness of 0.5 $\mu$m were formed as the first conductive type semiconductor layer 21. An n-type $Al_{0.30}In_{0.70}Sb$ layer having a thickness of 0.02 $\mu$m and doped with $7 \times 10^{18}$ ($cm^{-3}$) of Sn was also formed as the first wide band gap layer 22. A non-doped $Al_{0.098}In_{0.902}Sb$ layer having a thickness of 2.0 $\mu$m was also formed as the active layer 23. A p-type $Al_{0.30}In_{0.70}Sb$ layer having a thickness of 0.02 $\mu$m and doped with $3 \times 10^{18}$ ($cm^{-3}$) of Zn was also formed as the second wide band gap layer 24. A p-type $Al_{0.098}In_{0.902}Sb$ layer having a thickness of 0.5 $\mu$m and doped with $3 \times 10^{18}$ ($cm^{-3}$) of Zn was also formed as the second conductive semiconductor layer 25.

Subsequently, a resist pattern was formed on the laminate structure of the compound semiconductors described above, and etching was performed to produce mesa-type compound semiconductor laminate portions 20. Furthermore, a resist pattern was again formed and etching was performed for device separation to form recesses 40 so that the plurality of mesa-type compound semiconductor laminate portions 20 are electrically independent of each other. After removal of the resist pattern, a silicon oxide layer having a thickness of 70 nm was formed as the first protective film 31 by PCVD on the entire surface (the GaAs substrate and the mesa-type compound semiconductor laminate portions 20 formed on the GaAs substrate). A silicon nitride layer having a thickness of 200 nm was formed as the second protective film 32 by PCVD on this silicon oxide layer. The film densities of the first protective film 31 and the second protective film 32 were 2.18 $g/cm^3$ and 2.61 $g/cm^3$, respectively. Contact holes were formed in parts of these two protective film layers, and titanium (Ti), platinum (Pt), and gold (Au) were laminated in this order so as to cover the contact holes to thereby form the electrode portions 50. Thus, 63 compound semiconductor devices 1 that were connected in series were obtained. The resultant compound semiconductor devices 1 had the structure illustrated in the schematic cross-sectional view in FIG. 2. The depth of the recess 40 was about 800 nm, and the thickness of the silicon oxide layer as the first protective film 31 was 70 nm.

Example 2

On a GaAs substrate as the insulating substrate 10, the first conductive semiconductor layer 21, the first wide band gap layer 22, the active layer 23, the second wide band gap layer 24, and the second conductive semiconductor layer 25 were sequentially laminated in an MBE apparatus. In this lamination step, an n-type InSb layer having a thickness of 0.5 $\mu$m and doped with $7 \times 10^{18}$ ($cm^{-3}$) of Sn and an n-type $Al_{0.062}In_{0.938}Sb$ layer having a thickness of 0.5 $\mu$m were formed as the first conductive type semiconductor layer 21. An n-type $Al_{0.22}In_{0.78}Sb$ layer having a thickness of 0.02 $\mu$m and doped with $7 \times 10^{18}$ ($cm^{-3}$) of Sn was also formed as a first wide band gap layer 22. A non-doped $Al_{0.062}In_{0.938}Sb$ layer having a thickness of 2.0 $\mu$m was also formed as the active layer 23. A p-type $Al_{0.22}In_{0.78}Sb$ layer having a thickness of 0.02 $\mu$m and doped with $3 \times 10^{18}$ ($cm^{-3}$) of Zn was also formed as the second wide band gap layer 24. A p-type $Al_{0.062}In_{0.938}Sb$ layer having a thickness of 0.5 $\mu$m and doped with $3 \times 10^{18}$ ($cm^{-3}$) of Zn was also formed as the second conductive semiconductor layer 25. Other than these layers, the compound semiconductor devices 1 were obtained in a manner similar to Example 1.

Example 3

An InSb layer having a thickness of 2.0 $\mu$m and doped with $3 \times 10^{17}$ ($cm^{-3}$) of Zn was formed as the active layer 23, no first wide band gap layer 22 was formed, and a silicon oxide layer as the first protective film 31 was formed to a thickness of 170 nm. Other than these differences, the compound semiconductor device 1 was obtained in a manner similar to Example 1.

Comparative Example 1

On a GaAs substrate as the insulating substrate 10, the first conductive semiconductor layer 21, the active layer 23, the second wide band gap layer 24, and the second conductive semiconductor layer 25 were sequentially laminated in an MBE apparatus. In this lamination step, an n-type InSb layer having a thickness of 1 $\mu$m and doped with $7 \times 10^{18}$ ($cm^{-3}$) of Sn was formed as the first conductive semiconductor layer 21. An InSb layer having a thickness of 2.0 $\mu$m and doped with $3 \times 10^{17}$ ($cm^{-3}$) of Zn was also formed as the active layer 23. A p-type $Al_{0.18}In_{0.82}Sb$ layer having a thickness of 0.02 $\mu$m and doped with $3 \times 10^{18}$ ($cm^{-3}$) of Zn was also formed as the second wide band gap layer 24. A p-type InSb layer having a thickness of 0.5 $\mu$m and doped with $3 \times 10^{18}$ ($cm^{-3}$) of Zn was also formed as the second conductive semiconductor layer 25.

Subsequently, a resist pattern was formed on the laminate structure of the compound semiconductors described above, and etching was performed to produce mesa-type compound semiconductor laminate portions 20. In addition, a hard mask of silicon oxide was formed to a thickness of 350 nm and etching was performed for device separation so that the plurality of mesa-type compound semiconductor laminate portions 20 are electrically independent of each other. The silicon oxide hard mask etched down to about 200 nm by etching for element separation served as the first protective film 31 as it was. Thereafter, a silicon nitride layer as the second protective film 32 was formed to a thickness of 200 nm by PCVD on the entire surface (the silicon oxide layer formed on the GaAs substrate and the mesa-type compound semiconductor laminate portions 20). The film densities of the first protective film 31 and the second protective film 32 were 2.25 g/cm³ and 2.35 g/cm³, respectively. Contact holes were formed in parts of these two protective film layers, and titanium (Ti), platinum (Pt), and gold (Au) were laminated in this order so as to cover the contact holes to thereby form the electrode portions 50. Thus, 63 compound semiconductor devices 1 that were connected in series were obtained. The resultant compound semiconductor devices 1 had the structure illustrated in the schematic cross-sectional view in FIG. 4, and did not have the first protective film 31 in the recess 40.

Comparative Example 2

Compound semiconductor devices 1 were produced in a manner similar to Comparative Example 1, except that a first protective film 31 was not formed and the second protective film 32 made of silicon nitride was made so as to in direct contact with the side surfaces of the mesa-type compound semiconductor laminate portions 20.

<Evaluations>

The electrical resistances in the vicinity of zero bias region of the compound semiconductor devices 1 produced in Examples 1 to 3 and Comparative Examples 1 to 2 were measured. The electrical resistance in the vicinity of zero bias region of a compound semiconductor device 1 corresponds to the device resistance R0 of the compound semiconductor device 1 in the above expression of the SNR and is therefore denoted as "R0" in the following.

Figure 6:
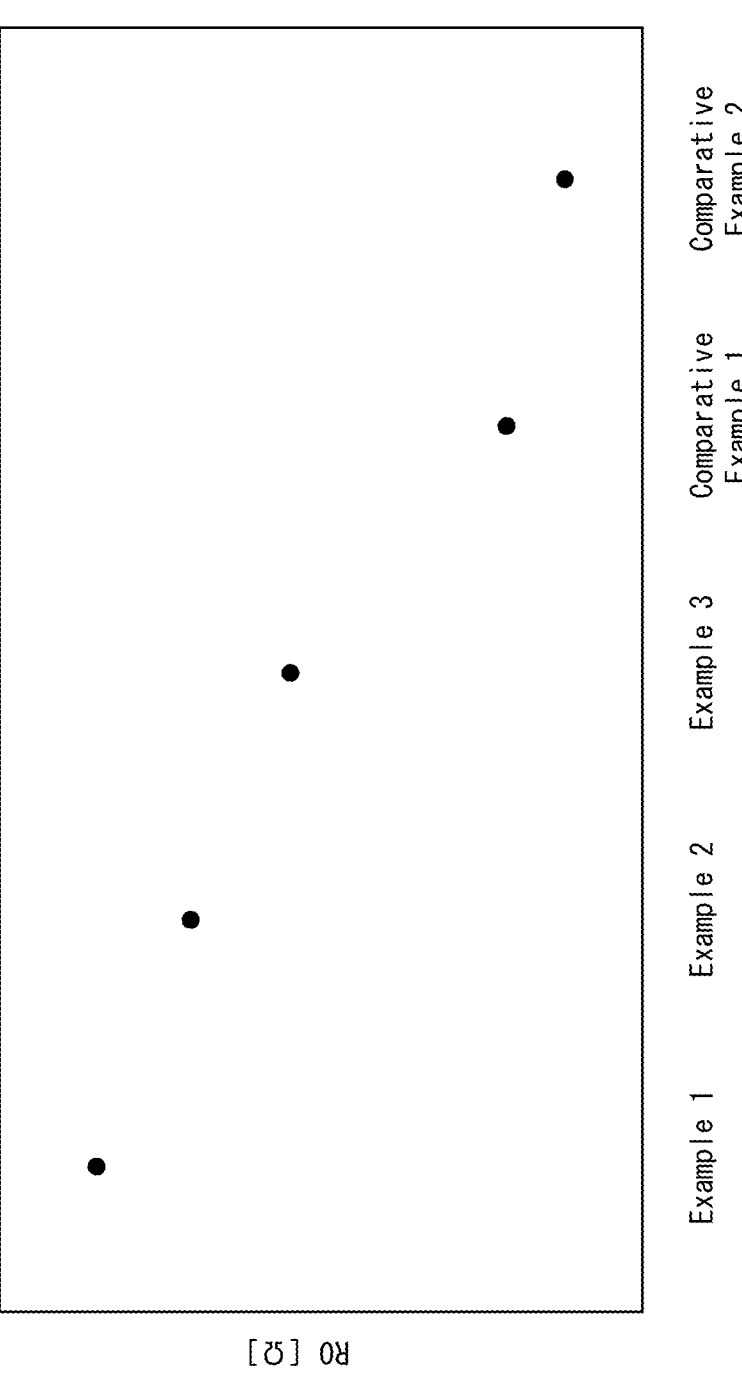
FIG. 6 is a graph indicating the electrical resistances of the compound semiconductor devices of Examples 1 to 3 and Comparative Examples 1 to 2 in the vicinity of zero bias.

FIG. 6 depicts the electrical resistances (R0) in the vicinity of zero bias region of the resultant compound semiconductor devices 1 determined based on the measurement results of Examples 1 to 3 and Comparative Examples 1 to 2.

As depicted in FIG. 6, the electrical resistances in the vicinity of zero bias region of the compound semiconductor devices 1 in Examples 1 to 3 were higher than those of Comparative Examples 1 to 2. In other words, the structure of the compound semiconductor devices 1 described in the above embodiment was proven to improve the SNR characteristic.

Although the compound semiconductor device 1 in the present disclosure has been primarily described herein as a light receiving device, a light emitting device can also be fabricated with the same structure. A compound semiconductor device 1 which serves as a light emitting device having the same structure provides the effect of suppressing leakage current between the mesa-type compound semiconductor laminate portions 20 as in a light receiving device. Because leakage current is suppressed in a compound semiconductor device 1 serving as a light emitting device, the charge injection efficiency into the active layer 23 is improved. In other words, a compound semiconductor device 1 having a high light emission efficiency can be provided.

The invention claimed is:

1. A compound semiconductor device comprising:
an insulating substrate;
a plurality of mesa-type compound semiconductor laminate portions formed on one primary surface of the insulating substrate, the plurality of mesa-type compound semiconductor laminate portions each having a first compound semiconductor layer having a first conductivity type, an active layer made of a compound semiconductor material, and a second compound semiconductor layer having a second conductivity type, which are laminated in this order;
a first protective film formed so as to be in direct contact with side surfaces of the mesa-type compound semiconductor laminate portions;
a second protective film formed on the first protective film and made of a material having a film density greater than that of the first protective film; and
a recess comprising recess side surfaces at least partially facing parts of side surfaces of the first compound semiconductor layer and a recess bottom surface at least partially facing a part of a surface of the insulating substrate on a side of the first compound semiconductor layer, the recess separating the plurality of mesa-type compound semiconductor laminate portions from each other,
the recess side surfaces and the recess bottom surface being covered with the first protective film and the second protective film,
wherein the part of a surface of the insulating substrate facing the bottom portion of the recess is formed by removing a part of the insulating substrate,
the total thickness of the first protective film and the second protective film is smaller than a step height defined by a distance between a surface of the insulating substrate in contact with the mesa-type compound semiconductor laminate portions and the recess bottom surface,
the thickness is a length measured in the vertical direction from a boundary between the insulating substrate or the mesa-type compound semiconductor laminate portion and the first protective film, and
an upper surface of the second protective film is positioned to be lower than the boundary between the insulating substrate and the mesa-type compound semiconductor laminate portions.

2. The compound semiconductor device according to claim 1, wherein the active layer comprises at least a group III element.

3. The compound semiconductor device according to claim 1, wherein the active layer has a carrier concentration of $4.1 \times 10^{16}$ cm⁻³ or less at 300 K.

4. The compound semiconductor device according to claim 1, wherein the active layer comprises at least In, and Sb or As.

5. The compound semiconductor device according to claim 1, wherein a ratio n (%) of an Al composition to all group III elements in a layer of the active layer satisfies $0 \leq n < 18$.

6. The compound semiconductor device according to claim 1, wherein the ratio n (%) of the Al composition to the all group III elements in the layer of the active layer satisfies $0 \leq n < 9.8$.

7. The compound semiconductor device according to claim 1, wherein the first protective film is made of a material having a film density of less than 2.25 g/cm³.

8. The compound semiconductor device according to claim 1, wherein the first protective film is made of silicon oxide, and the second protective film is made of silicon nitride.

9. The compound semiconductor device according to claim 1, wherein a thickness of the second protective film is greater than a thickness of the first protective film.

10. The compound semiconductor device according to claim 9, wherein the thickness of the second protective film is twice or more the thickness of the first protective film.

11. The compound semiconductor device according to claim 1, wherein another major surface of the insulating substrate is a light-receiving surface or a light-emitting surface.

12. A compound semiconductor device comprising:

an insulating substrate;

a plurality of mesa-type compound semiconductor laminate portions formed on one primary surface of the insulating substrate, the plurality of mesa-type compound semiconductor laminate portions each having a first compound semiconductor layer having a first conductivity type, an active layer made of a compound semiconductor material, and a second compound semiconductor layer having a second conductivity type, which are laminated in this order;

a first protective film formed so as to be in direct contact with side surfaces of the mesa-type compound semiconductor laminate portions;

a second protective film formed on the first protective film and made of a material having a film density greater than that of the first protective film; and a recess comprising recess side surfaces at least partially facing parts of side surfaces of the first compound semiconductor layer and a recess bottom surface at least partially facing a part of a surface of the insulating substrate on a side of the first compound semiconductor layer, the recess separating the plurality of mesa-type compound semiconductor laminate portions from each other, the recess side surfaces and the recess bottom surface being covered with the first protective film and the second protective film, wherein the thickness of the second protective film is 1.2 times or more the thickness of the first protective film.

13. The compound semiconductor device according to claim 12, wherein the thickness of the second protective film is twice or more the thickness of the first protective film.

14. The compound semiconductor device according to claim 12, wherein the active layer comprises at least In, and Sb or As.

15. The compound semiconductor device according to claim 12, wherein a ratio n (%) of an Al composition to all group III elements in a layer of the active layer satisfies $0 \leq n < 18$.

16. The compound semiconductor device according to claim 12, wherein the first protective film is made of silicon oxide, and wherein the second protective film is made of silicon nitride.

17. The compound semiconductor device according to claim 12, wherein a total thickness of the first protective film and the second protective film is smaller than the depth of the recess.

18. The compound semiconductor device according to claim 12, wherein the part of a surface of the insulating substrate facing the bottom portion of the recess is formed by removing a part of the insulating substrate.

19. The compound semiconductor device according to claim 18, wherein the total thickness of the first protective film and the second protective film is smaller than a step height defined by a distance between a surface of the insulating substrate in contact with the mesa-type compound semiconductor laminate portions and the recess bottom surface, the thickness is a length measured in the vertical direction from a boundary between the insulating substrate or the mesa-type compound semiconductor laminate portion and the first protective film, and wherein a upper surface of the second protective film is positioned to be lower than the boundary between the insulating substrate and the mesa-type compound semiconductor laminate portions.

20. The compound semiconductor device according to claim 12, wherein another major surface of the insulating substrate is a light-receiving surface or a light-emitting surface.

* * * * *